US010423492B2

(12) United States Patent
Lo

(10) Patent No.: US 10,423,492 B2
(45) Date of Patent: Sep. 24, 2019

(54) SELF ERROR-HANDLING FLASH MEMORY DEVICE

(71) Applicant: SK Hynix Inc., Gyeonggi-do (KR)

(72) Inventor: Yungcheng Thomas Lo, Cupertino, CA (US)

(73) Assignee: SK Hynix Inc., Gyeonggi-do (KR)

( * ) Notice: Subject to any disclaimer, the term of this patent is extended or adjusted under 35 U.S.C. 154(b) by 62 days.

(21) Appl. No.: 15/421,109

(22) Filed: Jan. 31, 2017

(65) Prior Publication Data

US 2017/0336974 A1 Nov. 23, 2017

Related U.S. Application Data

(60) Provisional application No. 62/337,784, filed on May 17, 2016.

(51) Int. Cl.
G06F 11/14 (2006.01)
G06F 11/08 (2006.01)
G11C 29/00 (2006.01)
G11C 29/42 (2006.01)
G11C 29/52 (2006.01)
G11C 29/02 (2006.01)

(52) U.S. Cl.
CPC ......... G06F 11/1402 (2013.01); G06F 11/08 (2013.01); G11C 29/00 (2013.01); G11C 29/42 (2013.01); G11C 29/52 (2013.01); G11C 29/021 (2013.01); G11C 29/028 (2013.01)

(58) Field of Classification Search
CPC ........ G06F 3/061; G06F 3/0655; G06F 3/064; G06F 3/0634; G06F 3/0619; G06F 3/0679; G06F 11/1402; G06F 11/0793; G06F 11/076; G06F 11/0727
See application file for complete search history.

(56) References Cited

U.S. PATENT DOCUMENTS

| 7,814,401 | B2 | 10/2010 | Alrod et al. | |
| 9,274,893 | B2 | 3/2016 | Chen | |
| 2004/0205352 | A1* | 10/2004 | Ohyama | G06F 21/85 713/194 |
| 2013/0080858 | A1* | 3/2013 | Lee | G11C 16/26 714/773 |
| 2013/0185612 | A1 | 7/2013 | Lee et al. | |
| 2013/0343131 | A1* | 12/2013 | Wu | G11C 16/26 365/185.24 |

* cited by examiner

Primary Examiner — April Y Blair
Assistant Examiner — Rong Tang
(74) Attorney, Agent, or Firm — Kilpatrick Townsend & Stockton LLP

(57) ABSTRACT

A flash memory device includes a flash memory configured to store a plurality of pages and a control circuit coupled to the flash memory. The control circuit is configured to retrieve data from a page of the flash memory, determine a number of zeroes or ones of the retrieved data, determine whether the number is between a first value and a second value, and determine that the retrieved data has one or more errors based on determining that the number is not between the first value and the second value.

15 Claims, 7 Drawing Sheets

SELF ERROR-HANDLING FLASH MEMORY DEVICE

CROSS-REFERENCES TO RELATED APPLICATIONS

This application claims the benefit of priority under 35 U.S.C. § 119(e) to U.S. Provisional Application No. 62/337,784, filed May 17, 2016, which is hereby incorporated by reference in its entirety and for all purposes.

BACKGROUND OF THE INVENTION

The present invention relates to a storage device. More particular, embodiments of the present invention relate to a flash memory based storage device and error-correction techniques for improving performance.

Non-volatile memory devices such as Solid State Drives (SSDs) are finding new applications in consumer electronics. For example, they are replacing Hard Disk Drives (HDDs), which typically comprise rapidly rotating disks (platters). Non-volatile memories, sometimes referred to as 'flash memories' (for example, NAND and NOR flash devices), are used in media storage, cameras, mobile phones, mobile computers, laptop computers, USB flash drives, etc. A non-volatile memory provides a relatively reliable, compact, cost-effective, and easily accessible means of storing data when its power supply is off.

Flash memory controllers are used to manage the data stored in the non-volatile memory, and to act as an interface between a host and the non-volatile memory. In general, a flash memory controller decodes data read from a flash memory and attempts to correct errors in the read data. If the flash memory controller cannot correct the errors, it will send a request for read retry by sending a next threshold voltage to the flash memory. The read retry process will continue until the flash memory controller can receive error-free data or data with correctable errors. However, data transfer between a flash memory controller and a flash memory consumes resources (bandwidth, power) and is time intensive.

Thus, there is a need to provide an improved way to reduce data traffic between a flash memory controller and a non-volatile flash memory.

BRIEF SUMMARY OF THE INVENTION

Embodiments of the present invention provide a flash memory device and method of operating a flash memory that can eliminate the above-described problems.

According to embodiments of the present invention, a flash memory device may include a flash memory configured to store a plurality of pages and a control circuit coupled to the flash memory. The control circuit is configured to retrieve data from a page of the flash memory, determine a number of zeroes or ones of the retrieved data, determine whether the number is between a first value and a second value, and determine that retrieved data has one or more errors based on determining that the number is not between the first value and the second value.

In one embodiment, a number that is half a number of bits included in the retrieved data is between the first value and the second value.

In one embodiment, the flash memory device may further include a read retry table (RRT) including a plurality of entries, each of the entries associated with a voltage level. The control circuit is configured to retrieve data from the flash memory using a first voltage level from the RRT.

In one embodiment, the control circuit is further configured to retrieve data from the page of flash memory using a second voltage level from the RRT based on determining that the retrieved data using the first voltage level has one or more errors.

In one embodiment, the control circuit is further configured to determine a second number of zeroes or ones of the retrieved data, determine whether the number is between the first value and the second value, and determine that retrieved data has one or more errors based on determining that the number is not between the first value and the second value.

In one embodiment, the control circuit includes a counter configured to determine the number of zeroes or ones.

In one embodiment, the control circuit receives a request for data from the page from a controller coupled to the flash memory device prior to retrieving data from the flash memory using the first voltage level.

In one embodiment, the retrieved data is scrambled data, and the flash memory device further includes a scrambler configured to scramble data received from a controller coupled to the flash memory device prior to storing data to the page of the flash memory.

In one embodiment, the flash memory device further includes a descrambler configured to descramble data prior to outputting the descrambled data to the controller.

Embodiments of the present invention also provide a flash memory device that may include a flash memory configured to store a plurality of pages and a control circuit coupled to the flash memory. The control circuit is configured to retrieve data from a page of the flash memory, determine a ratio of ones and zeros in the retrieved data, determine whether the ratio is between a first value and a second value, and determine that retrieved data has one or more errors based on determining that the ratio is not between the first value and the second value.

In one embodiment, the ratio of ones and zeros in the retrieved data that is 1 lies between the first value and the second value.

In one embodiment, the flash memory device may further include a read retry table (RRT) including a plurality of entries, each of the entries is associated with a voltage level, and the control circuit is configured to retrieve data from the flash memory using a first voltage level from the RRT.

In one embodiment, the control circuit is further configured to retrieve data from the page of flash memory using a second voltage level from the RRT based on determining that the retrieved data using the first voltage level has one or more errors.

Embodiments of the present invention also provide a method of operating a flash memory device comprising a flash memory including a plurality of pages, a read retry table (RRT) comprising a plurality of voltage levels, a control circuit, and a scrambler. The flash memory, the RRT, the control circuit, the scrambler are fabricated on a same die. The method may include retrieving data from a page of the flash memory, determining a number of zeroes or ones of the retrieved data, determining whether the number is between a first value and a second value, and determining that the retrieved data has one or more errors based on determining that the number is not between a first value and a second value.

In one embodiment, a number that is half a number of bits included in the retrieved data is between the first value and the second value.

In one embodiment, the RRT includes a plurality of entries, each of the entries is associated with a voltage level, and the method may further includes retrieving data from the page of the flash memory using a first voltage level from the RRT.

In one embodiment, the method may further include retrieving data from the page of the flash memory using a second voltage level from the RRT based on determining that the retrieved data using the first voltage level has one or more errors.

In one embodiment, the method may further include determining a second number of zeroes or ones of the retrieved data, determining whether the second number is between the first value and the second value, and determining that the retrieved data has one or more errors based on determining that the number is not between the first value and the second value.

In one embodiment, the retrieved data is scrambled data.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It will be understood that the drawings are not drawn to scale, and similar reference numbers are used for representing similar elements. Embodiments of the invention are described herein with reference to functional block diagrams that are schematic illustrations of idealized embodiments (and intermediate structures) of the invention.

It will be understood that, when an element or component is referred to as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

Embodiments of the present invention may be implemented in hardware, software, and firmware. Embodiments of the present invention may be implemented as instructions contained in a memory, which can be read and executed by the control circuit.

Figure 1:
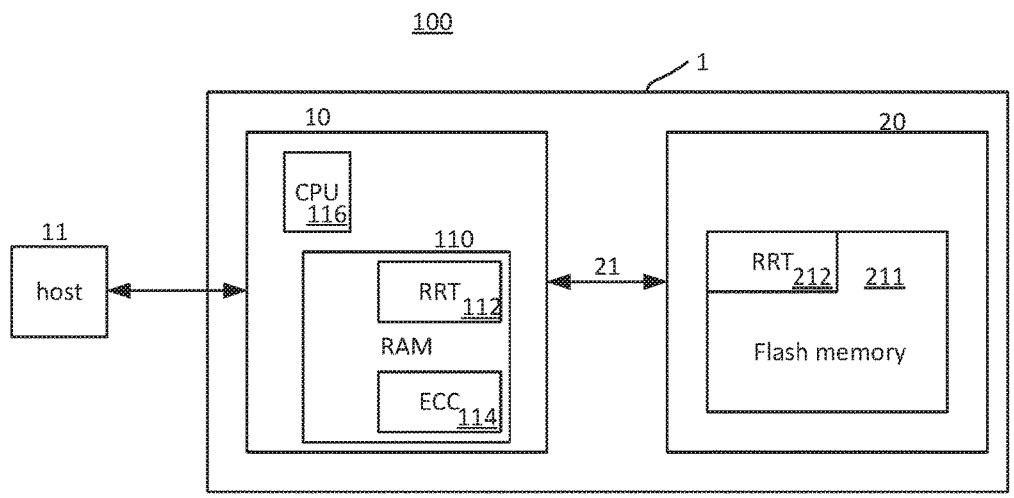
FIG. 1 is a simplified block diagram illustrating a system including a host device and a storage device comprising a flash memory controller and a flash memory device.

FIG. 1 is a simplified block diagram illustrating a system 100 including a host 11 coupled to a storage device 1. Storage device 1 may include a flash memory controller 10 coupled to a flash memory device 20. In some embodiments, flash memory controller 10 is separated from flash memory 20 and includes a RAM 110 configured to store data, a read retry table (RRT) 112, an error checking and correction code (ECC) 114. Flash memory controller 10 may also include a CPU 116 comprising one or more processing units configured to perform error checking and correction operations on data and communication with host 11. Flash memory device 20 may includes a flash memory array 211 and a RRT 212. Flash memory controller 10 and flash memory device 20 communicate with each other through a connection bus 21. RRT 212 contains voltage levels information related to process, voltage, and temperature variations associated with the flash memory. Voltage levels or thresholds are set during the manufacturing of the flash memory.

In conventional techniques, at power up, the content of RTT 212 of flash memory device 20 is transferred to RRT 112 of flash memory controller 10. Flash memory controller 10 can read or write data to flash memory device 20 one page at the time. Data stored in flash memory 20 can be accessed by controller 10 through connection bus 21. When the connection bus is 8 bits wide (1 byte), then the flash memory controller reads out data from the flash memory sequentially byte by byte. For example, if the page contains 4096 bytes, at least 4096 clocks are necessary to read out the page.

In conventional operating systems, the flash memory controller which is external to the flash memory device is used to determine the validity of data read out from the flash memory by performing an error detection and correction operation. For example, software or hardware in the controller will perform an error checking and correction coding (ECC) to the data prior to sending the ECC coded data and the overhead data to the flash memory for storage. When reading data from the flash memory device, the flash memory controller will perform an ECC operation to decode the received data to detect and correct eventual errors, if the errors are correctable. ECC 114 detects and corrects errors in data read from flash memory device 20. CPU 116 sends commands to flash memory 20 and controls data transmission between flash memory controller 10 and flash memory 20 through connection bus 21.

When the ECC of the flash memory controller determines that data read are not correctable, the CPU will send a new voltage level from the RRT to the flash memory to have the flash memory device reread data of the selected page using the new voltage level. In certain implementations, data of a selected page must be read out sequentially byte by byte by the flash memory controller, the flash memory controller then determines whether the received data of the page are correct by performing the error checking and correction decoding operation. That means, in certain implementations, if the page contains 4096 bytes and the I/O connection is 8-bits wide, then at least 4096 clocks are required to transmit the page. And the process repeats until data read out from the page has either no errors or the errors are correctable by the controller. This way of reading out data from the flash memory is time intensive and consumes power as data passes through the connection bus.

Figure 2:
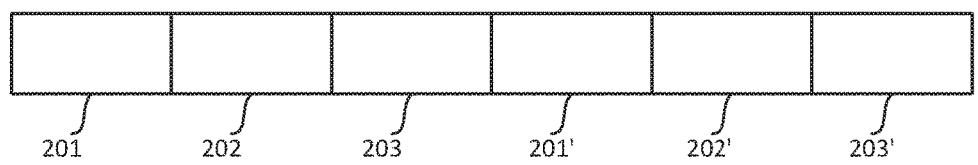
FIG. 2 is a timing diagram of a read retry operation of a conventional reread technique.

FIG. 2 is a timing diagram of a read retry operation as known in the art. The read operation of a first read retry operation includes operations indicated by reference numerals 201, 201, and 203. Operation 201 includes the flash memory controller sending a command and the address of a page to be read together with a first read voltage level to the flash memory for reading out a page. Operation 202 includes the time for the controller to receive data of the selected page from the flash memory device. Operation 203 includes the ECC calculation time to determine whether the received data containing errors and whether the errors are correctable. In the case that the errors are not correctable, the flash memory controller has to repeat operations 201 through 203 indicated as 201', 203', and 203', and so on. For example, the controller in operation 201' sends a new read command with a second voltage level to read data of the same page. Operations 202' and 203' correspond to the operations 202 and 203. This way of reading out data not only consumes unnecessarily channel bandwidth and power between the controller and the flash memory device, but also time.

Figure 3:
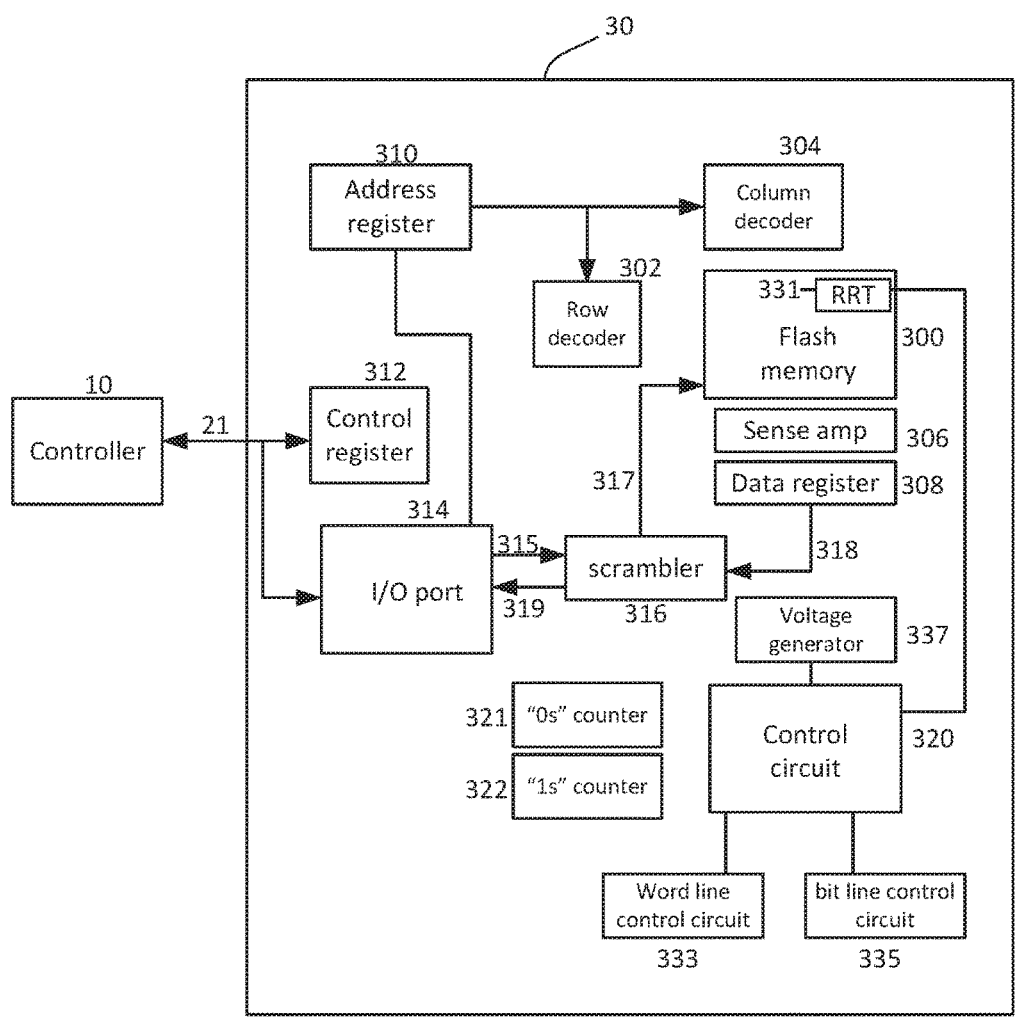
FIG. 3 is a block diagram of a flash memory device including a control circuit, a read retry table, a scrambler/descrambler according to an exemplary embodiment of the present invention.

FIG. 3 is a functional block diagram of a flash memory device 30 according to embodiments of the present invention. Flash memory device 30 includes a flash memory 300, a row decoder 302, a column decoder 304, a sense amplifier 306, a data register 308, and an address register 310. In some implementations, flash memory 300 may be made of NAND flash cells. An SLC (single level cell) NAND cell can support one bit per cell, and an MLC (multi-level cell) NAND cell can support two or more bits per cell. Single NAND flash cells that individually store a single bit of 0 or 1 can be joined together in strings and arrays to form much larger data storage structures. These strings can be connected to allow storage and retrieval of data from selected cells. A row of NAND cells can make up a word-line (WL) and is generally the smallest unit to program. A page generally shares the same word-line and can comprise thousands of NAND flash cells. For example, typical page sizes can include 16K, 32K, 64K or 128K NAND cells. A block can include a two-dimensional matrix comprising pages (rows) and strings (columns). Flash memory device 30 also includes a control register 312 and an I/O port 314. Control register 312 is coupled to a flash memory controller 10 that is external to flash memory device 30. Control register 312 is configured to receive commands (e.g., CE, CLE, ALE, WE, RE, WP, etc.) from flash memory controller 10. For example, command CE (chip enable) selects flash memory device 30; command CLE (chip latch enable) is to control loading of a command from the external controller to the flash memory device; command ALE (address latch enable) is to latch the address to the address register; command WE (write enable) is to acquire data from the I/O port; RE (read enable) is to read data out from the data register; WP (write program) is to write data to the memory cell array. The I/O port is configured to transfer address, data to and from the flash memory controller through a connection bus 21. Connection bus 21 may be physically implemented in a number of ways. For example, the connection bus may include a number of physical connection lines that are used to transmit data, addresses, commands. The connection bus may include a source synchronous connection or a clock-recovered asynchronous connection.

Flash memory device 30 further includes a scrambler 316 and a control circuit 320. Control circuit 320 is processing circuitry configured to control flash memory device 30 during various operating modes. In certain implementations, control circuit 320 may also include a memory and one or more processing units configured to execute instructions stored in the memory. Scrambler 316 is used to convert input data into output data that have the same length (i.e., same number of bits) but the output data is randomized to have a substantially equal number of 0s and 1s. Scrambler 316 is coupled to the I/O port and configured to scramble received data 315 into scrambled data 317 for storage in flash memory 300. Scrambled data 317 has a substantially equal probability of being "0" and "1", so that the ratio of the number of 0s to the number of 1s is substantially close to 1. Scrambler 316 may include one linear feedback shift register (LFSR), a plurality of LFSRs connected in parallel, or a parallel scrambler. A LFSR processes data in bit sequences. The parallel-connected LFSRs may include a number of LFSRs, each having a different or the same seed to scramble the parallel data bit by bit. A parallel scrambler is able to receive data byte-wise or word-wise and scramble data byte-by-byte (8 bits by 8 bits) or word-by word (16 bits by 16 bits). In an embodiment, scrambler 316 is a parallel self-synchronous scrambler/descrambler configured to scramble and descrambler data in byte and word format. When operating as a scrambler, scrambler 316 is configured to ensure that the scrambled data at its output have a high probability of equal numbers of '0s' and '1s'. When operating as a descrambler, scrambler 316 (which now functions as a descrambler) is configured to ensure that the descrambled data 319 at its output is the original data 315 before being scrambled. In other words, the scrambler has a first input configured to receive data 315 received from the controller before being stored and a second input configured to receive data 318 read out from flash memory 300. The scrambler also has a first output configured to output scrambled data 317 to flash memory 300 for storage and a second output configured to provide descrambled data 319 to the I/O port for transmitting to the external controller. Scrambler 316 is operable as a scrambler when receiving data 315 from I/O port 314 and as a descrambler when receiving data from 318 from memory array 300 through data register 308. This can be implemented using a multiplexer which is well known in the art and will not be described herein for the sake of brevity.

In certain implementations, the scrambling/descrambling function may be performed by flash controller 10 prior to transmitting data to flash memory device 30. According to embodiments of the present invention, the essential property of the scrambler is that the likelihood of the of 1s and the number of 0s it generates are essential equal. Other properties of the scrambler are not critical and the designer has considerable design freedom in designing suitable scramblers.

Flash memory device 30 may also include a word line control circuit 333, a bit line control circuit 335, and a voltage generator 337. Voltage generator 337 may be configured to generate the necessary voltages for read, write, erase operations under the control of control circuit 320.

Data are read out from a selected page of memory array 300 into data register 308, the total number of 0s and the total number of 1s in readout data 318 are counted. In certain implementations, only one of the total number of 0s and 1s in readout data 318 needs to be counted as the total number of bits in a page is known. For example, if control circuit counts the total number of 0s, the total of number of 1s can then be determined by the difference between the total number of bits in the page and the total number of counted 0s. In some embodiments, if the number of counted 0s or 1s is within a predetermined value range, the readout data is considered to be valid. For example, if the page has 4096 bytes, and the total counted number of bytes of 0s is 2048, then the readout data is considered to be correct data. The counting of the total number of 0s and 1s may be performed by control circuit 320 either by hardware, software, or a combination of hardware and software. In some embodiments, control circuit 320 may be coupled to a "0s" counter 321 configured to count the total number of "0s" in readout data 318, or a "1s" counter 322 configured to count the total number of "1s" in readout data 318, or both counters. In some embodiments, the 0s and/or 1s counters may be a binary counter including an accumulator and a shift register coupled to data register 308. The value of the accumulator is incremented by 1 when the shift register outputs a 0 or a 1. This counting method can also be implemented with software executed by control circuit 320.

In some embodiments, if the total counted number of 0s or 1s in the readout data is not within the predetermined threshold value range, control circuit 320 may determine that readout data 318 are erroneous, and applies a new voltage threshold value from RTT 331 to a selected word line read data out of the selected page of memory array 300 again using the new voltage threshold value.

In some embodiments, control circuit 320 may also include logic for determining the ratio of "0s" to "1s" or ratio of "1s" to "0s". In the case that the ratio is not within a predetermined range, control unit 320 determines that readout data 318 are erroneous, and applies a new voltage threshold value from RTT 331 to a selected word line read data out of the selected page of memory array 300 again using the new voltage threshold value.

Comparing to the conventional techniques, checking the validity of readout data is performed in flash memory device 30, so that the data bandwidth of the connection bus is only used to transmit good (valid) data instead of sending readout data by the flash memory device repeatedly using new threshold voltages received from the controller until the controller determines that the readout data is valid data. By having the flash memory device to verify the validity of readout data before sending it to the controller, the bandwidth consumption of the connection bus is reduced, thereby reducing power consumption and decreasing data latency.

Figure 4:
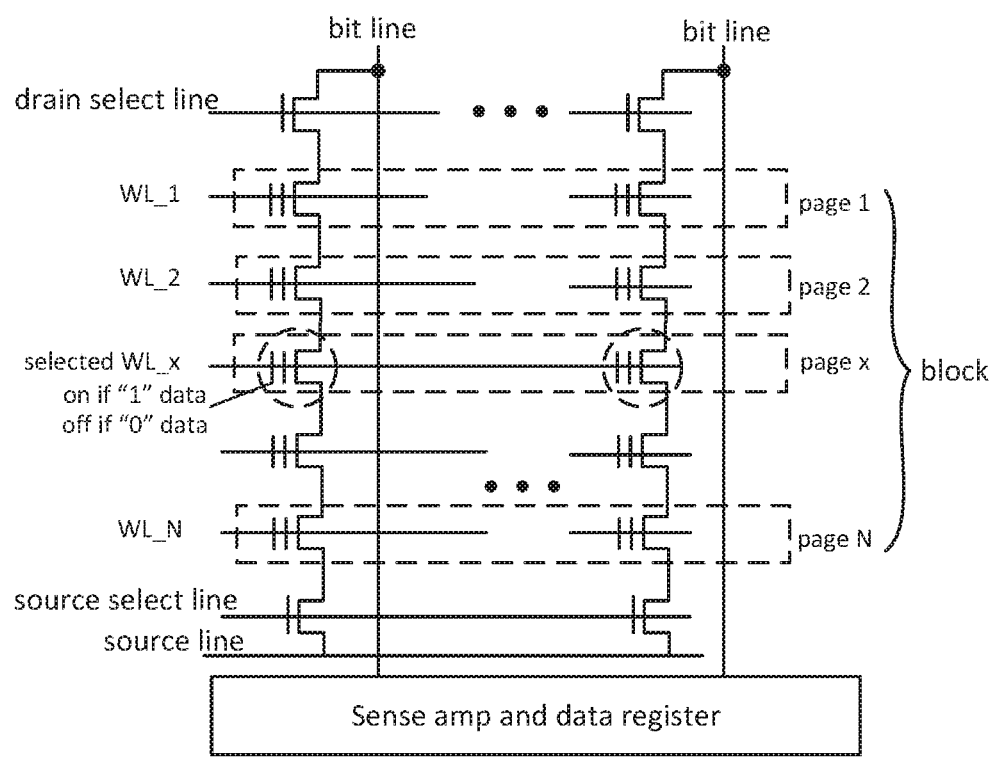
FIG. 4 is a schematic diagram of a flash memory according to an exemplary embodiment of the present invention.

FIG. 4 is a schematic diagram of a flash memory 40 according to an exemplary embodiment of the present invention. In some embodiments, flash memory 40 may be implemented as a memory cell array of NAND cells, NOR cells, or other non-volatile memory cells. In some embodiments, flash memory 40 may be flash memory device 30 of FIG. 3. Flash memory 40 may include a plurality of bit lines for connecting memory cells of the memory cell array, a plurality of word lines for selecting the pages. In an embodiment, the memory cells may include series-connected floating gate transistors that are disposed between drain select transistors (controlled by a drain select line) and source select transistors (controlled by a source select line). The source select transistors have the source terminal connected to a source line. The memory cells of a selected page are disposed on the cross points of the bit lines and the selected word line. When a write command or a read command is received from external controller 10, control circuit 320 controls word line control circuit 333 and bit line control circuit 335 together with voltage generator 337 to write data into memory array 300 or read data from the memory array. Word line control circuit 333 is configured to control the voltage applied to the word lines, and bit line control circuit 335 is configured to control the voltage applied to the bit lines.

Figure 5:
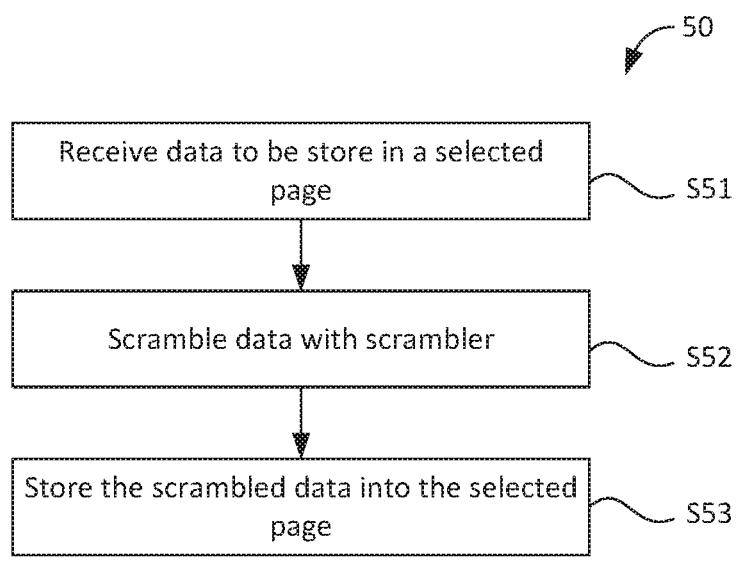
FIG. 5 is a flowchart illustrating a data writing method according to an exemplary embodiment of the present invention.

FIG. 5 is a flowchart illustrating a data writing method 50 according to an exemplary embodiment of the present invention. At S51, control register 312 receives a write command, data and an associated address from controller 10. The received address is then saved in address register 310 and provided to column decoder 304 and row decoder 302 for selecting a page of flash memory 300. At S52, the received data is provided to scrambler 316 such that the scrambled data has a high probability of close to equal numbers of 0s and 1s prior to being stored into the selected page. In some embodiments, the control circuit also counts the number of data bits or bytes received to ensure that sufficient bits or bytes are available to the scrambler. In the case that the received data do not have sufficient bytes or bits, the control circuit may cause the scrambler to add or append a sufficient amount of scrambled (randomized) data to the scrambled data. At S53, the scrambled data are stored into the selected page of the flash memory. In some embodiments, data received from the controller may already be scrambled by the controller, so that step S52 may be omitted. In some embodiments, the controller may send a special write command indicating to the flash memory device that the to-be-stored data has been scrambled, so that the scrambler in the flash memory device may be bypassed.

Figure 6A:
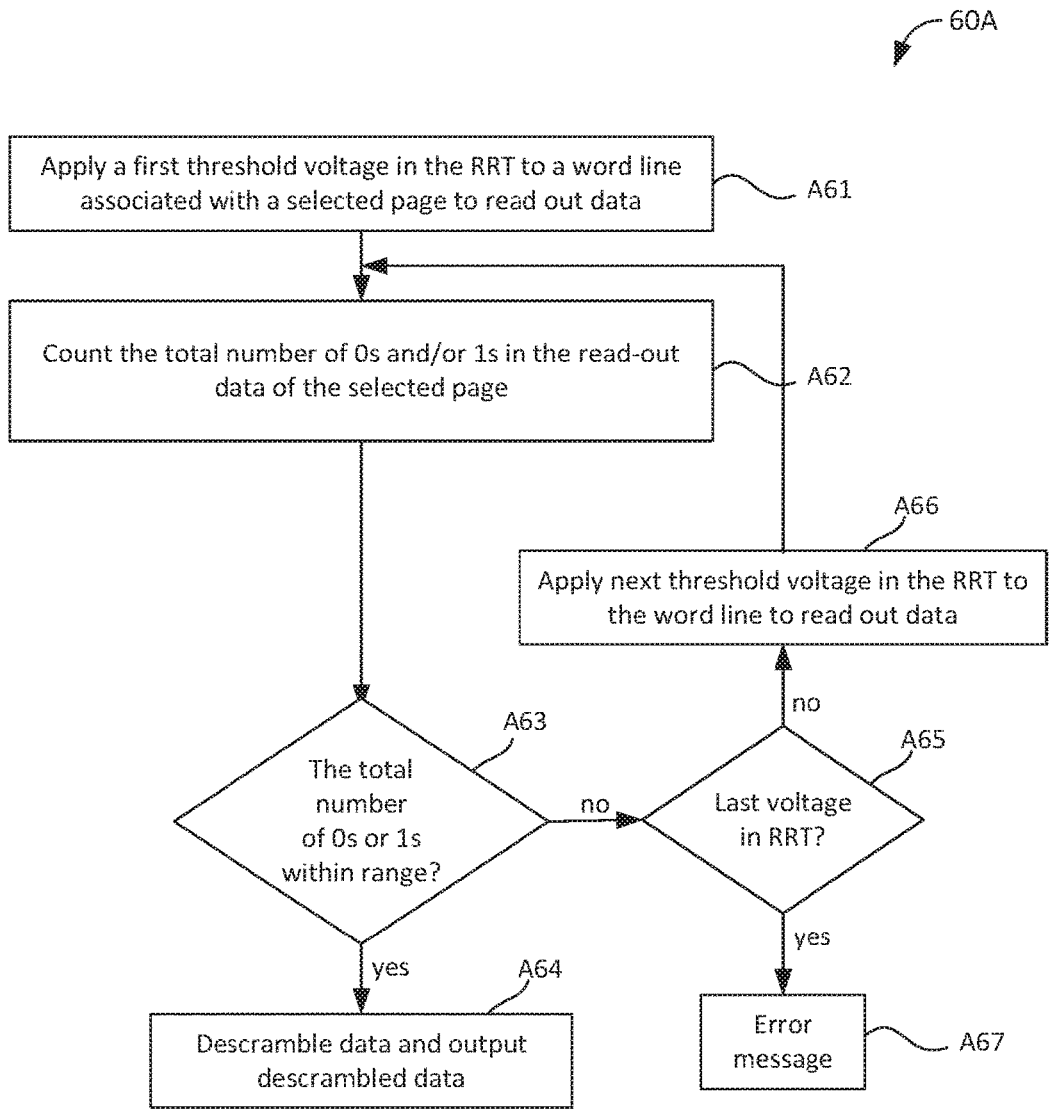
FIG. 6A is a flowchart illustrating a data reading method according to an exemplary embodiment of the present invention.

FIG. 6A is a flowchart illustrating a data reading method 60A according to an exemplary embodiment of the present invention. At A61, the control circuit applies a first threshold voltage from the read retry table (RRT) to a word line associated with a selected page of the memory array to read out data of the selected page. At A62, the control circuit counts the total number of 0s or 1s in the readout data. In an embodiment, the total number of 0s is counted. In another embodiment, the total number of 1s is counted. Because the total number of the bits is known in the page, the control circuit verifies whether the total number of counted 0s or 1s is within a predetermined value range, which is equal to half of the total number of bits in the page plus a margin at A63. For example, if the total number of bytes in a page is 4096 bytes, then the predetermined value range may be between 2000 and 2100 bytes. When the total number of counted 0s or 1s is within the predetermined value range, the control circuit determines that the readout data is correct (or valid) and provides the data that are temporarily stored in data register 308 to scrambler 316. At A64, the scrambler descrambled the readout data back to the original data format and provides the descrambled data to the I/O port. When the total number of counted 0s or 1s is not within the predetermined value range, the control circuit will determine whether or not all voltages in the RRT has been used. If there are still read try voltages available ("no" in A65) in the RRT, the control circuit causes the flash memory device to apply a next threshold voltage in the RRT to the word line to read out data of the selected page at A66 (read retry operation), and repeats steps A62 and A63 until either step A64 is reached or until all threshold voltages in the RTT have been applied ("yes" in A65). In the event where all threshold values are applied and no ratio is obtained within the predetermined range, the control circuit will send out an error message to the flash memory controller (A67). As used herein, the terms "first threshold voltage" and "next threshold voltage" are referred to as a threshold voltage to performing a read operation on the flash memory.

Figure 6B:
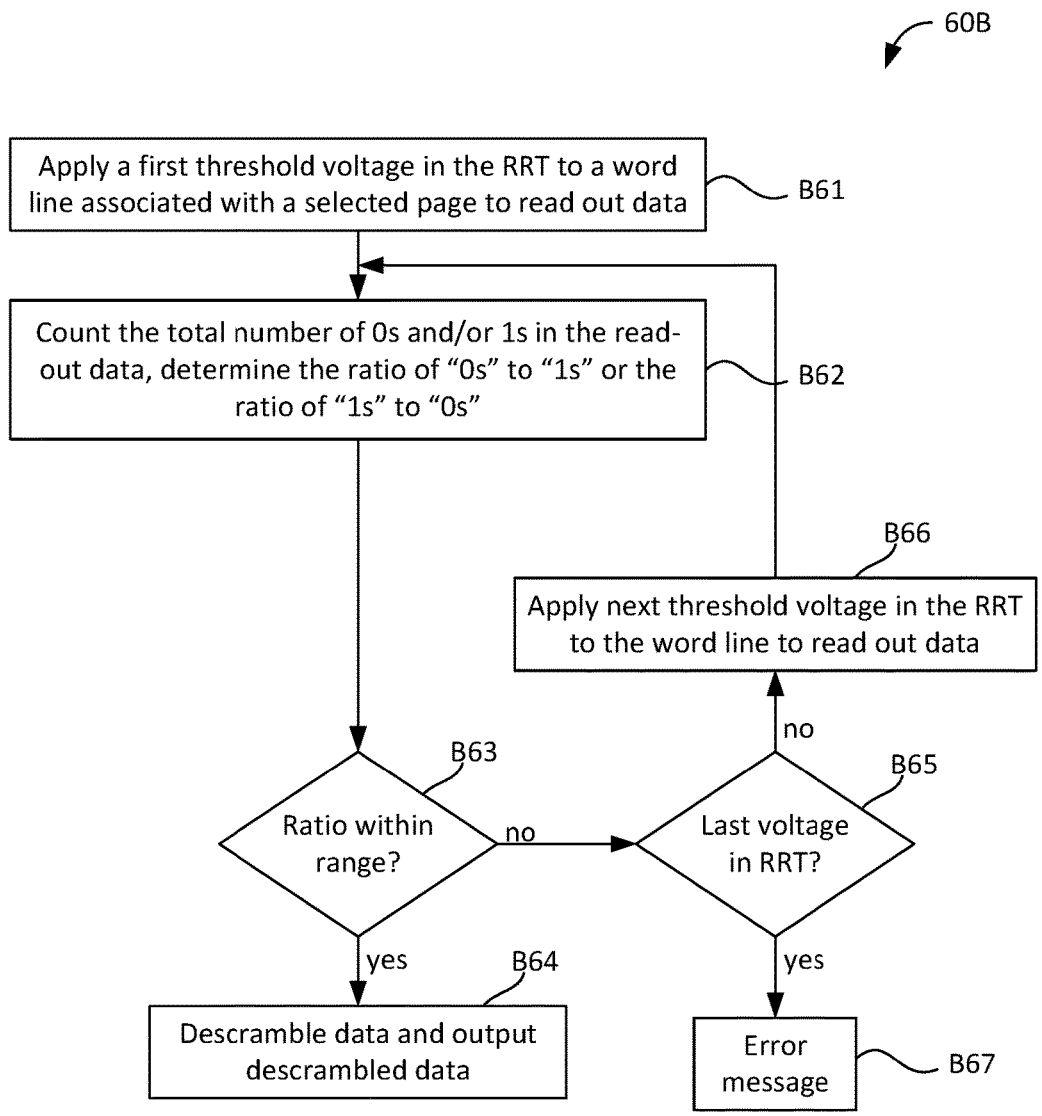
FIG. 6B is a flowchart illustrating a data reading method according to an exemplary embodiment of the present invention.

FIG. 6B is a flowchart illustrating a data reading method 60B according to another exemplary embodiment of the present invention. At B61, the control circuit applies a first threshold voltage to a word line associated with a selected page of the memory array to read out data of the selected page. At B62, the control circuit counts the total number of "0s" in the readout data. In an embodiment, since the total number of data bytes and bits are known, the total number of the is can be determined by the difference between the total number of bits and the total number of counted 0s. The control circuit then determines the ratio of the total number of 0s to the total number of 1s. In another embodiment, the ratio between the number of '0s' and the total number of bits is determined. In yet another embodiment, the number of '1s' is determined, and the ratio between the number of '1s' and the total number of bits is then determined. At B63, the control circuit determines whether the ratio is within a predetermined range, e.g., between 0.40 and 0.50, preferably between 0.45 and 0.55 when the ratio is between the number of '0s' (or '1s') and the total number of bits. Alternatively, the predetermined range may be 0.90 and 1.10, more preferably between 0.95 and 1.05 when the ratio is between the number of '0s' and '1s'. In the event that the ratio is within the predetermined range, the control circuit determines that the readout data is correct and provides the data that are temporarily stored in data register 308 to scrambler 316. At B64, the scrambler descrambled the readout data back to the original data format and provides the descrambled data to the I/O port. In the event that the ratio is not within the predetermined range, the control circuit will determine whether or not all voltages in the RRT has been used. If there are still read try voltages available ("no" in S65) in the RRT, the control circuit causes the memory device to apply a next threshold voltage in the RRT to the word line to read out data of the selected page at B66 (read retry operation), and repeats steps B62 and B63 until either step B64 is reached or until all threshold voltages in the RTT have been applied ("yes" in B65). In the even that all threshold values are applied and no ratio is obtained within the predetermined range, the control circuit will send out an error message to the external controller (B67). As used herein, the terms "first threshold voltage" and "next threshold voltage" are referred to as a threshold voltage to performing a read operation on the memory array.

Figure 7:
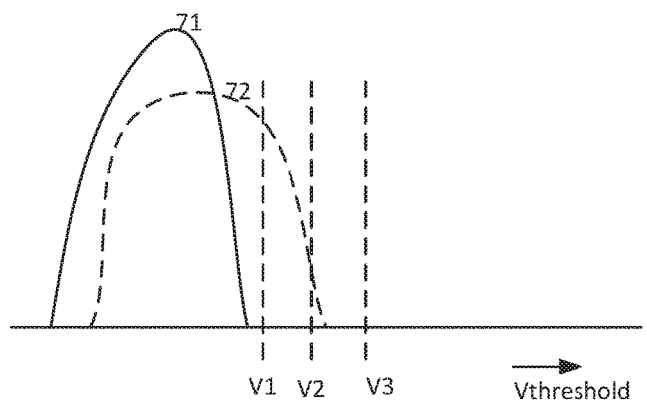
FIG. 7 is a diagram for explaining a read try operation in the memory device in FIG. 3 according to an exemplary embodiment of the present invention.

FIG. 7 is a conceptual diagram for explaining a read try operation in the flash memory device in FIG. 3. As shown in FIG. 7, curve 71 (solid line) represents the ideal cell distribution of "1s" (erase data) of the memory array, e.g., when it is first manufactured. Curve 72 (dotted line) represents the cell distribution of "1s" over time due to temperature variations and repeated erase and program operations. As can be seen, the distribution of curve 72 is shifted (and become wider) in relative to curve 71. Where a read operation with voltage V1 was successful, i.e., the total number of counted 0s or 1s in the selected page (as in FIG. 6A) or the ratio of "0s" to "1s" or the ratio of "0s" to the total number of bits is within a predetermined range (as in FIG. 6B), which is determined by the control circuit in step A63 (FIG. 6A) or B63 (FIG. 6B), respectively. The readout data is provided to the scrambler for descrambling in step A64 or B64. However, temperature variations and repeated use may cause the shift (and widening) of the cell distribution, so that reading data with the voltage V1 now fails (i.e., the control circuit determines that a read operation fails, e.g., the total number of counted 0s or 1s in the selected page or the ratio of the number of '0s' or '1s' to the total number of bits or the ratio of the number of '0s' to the number of '1s' is not within a predetermined range (A63, B63), the control circuit selects the next level of a read voltage and retries a read operation (A66, B66). The next level read voltage is applied to the select word line of the page storing the scrambled data. When the control circuit determines that the read operation is successful (i.e., the ratio is within the predetermined range), the control circuit will provide the scrambled data to the scrambler for descrambling and provide the descrambled to the flash memory controller through the connection bus.

Figure 8:
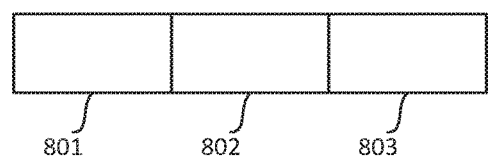
FIG. 8 is a timing diagram illustrating a data write operation according to an embodiment of the present invention.

FIG. 8 is a timing diagram for explaining a data write operation according to an embodiment of the present invention. Operation 801 includes the flash memory controller sending data to be stored in the flash memory device, a write command, and the address of a page into which the data is to be stored into. Operation 802 includes the flash memory device scrambling the received data. Operation 803 includes the flash memory device storing the scrambled data into the selected page of the flash memory. Operations 801, 802, and 803 are performed under the control of the control circuit together with the control register, the address register, the row and column decoders, the word line control circuit, the bit line control circuit, and the scrambler.

Figure 9:
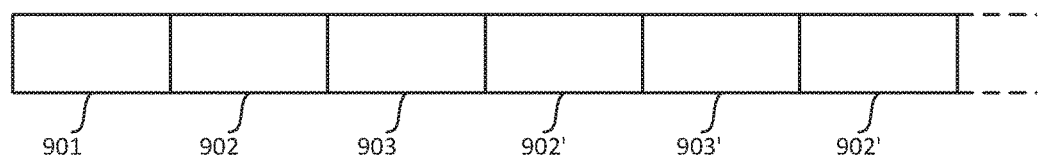
FIG. 9 is a timing diagram illustrating a read retry operation according to an embodiment of the present invention.

FIG. 9 is a timing diagram illustrating a read retry operation according to an embodiment of the present invention. Operation 901 includes the flash memory device receiving a read command and an address of a page containing data that a flash memory controller tries to access. The control circuit applies a first read threshold voltage in the RRT to a word line associated with a selected page to read out data (step A61, B61). Operation 902 includes the control circuit counting the number of zeros (0s) or the number of ones (1s)(step A62, B62) and determining the ratio of the number of 0s or 1s to the total number of bits corresponding to the readout data (step B62). The control circuit may also determine the number of 0s and the number of 1s in the readout data and calculate the ratio of the number of 0s to the number of 1s (step B62). One of skill in the art will appreciate that there are many ways of determining (or calculating) the ratio of the number of 0s to the number of 1s, and will not described herein for the sake of brevity. Operation 903 includes determining whether the total number of counted 0s or is in the selected page (step A63) or the ratio is within a predetermined range (step B63). When the total number of counted 0s or 1s or the ratio is determined to be within the range (step A63, B63), the control circuit will provide the readout data to a scrambler to descramble the data back to the original data format (i.e., converting the scrambled data back to the original format which is not scrambled) (step A64, B64). Operation 902 ends with the descrambled data is output to the external controller through the I/O port. When the total number of counted 0s or 1s in the selected page (step A63) or the ratio of 0s to 1s is not within the predetermined range, the control circuit will verify whether all threshold voltages have been used in the RRT (step A65, B65). When there are still threshold voltages unused in the RRT, the control circuit will apply the next available threshold voltage to the word line and repeat operations 902 and 903 (indicated as 902', 903').

The memory device in FIG. 3 has some advantages over conventional systems as the memory device can self select and adjust the threshold voltage based on the total number of counted 0s or 1s in the selected page or the ratio of read out 0s and 1s without the control of the flash memory controller. In accordance with the present invention, the communication between the flash memory device and the flash memory controller can thus be reduced, thereby providing a saving in time, power consumption, and an efficient use of the scarce interconnect bandwidth between the flash memory device and the flash memory controller.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A flash memory device, comprising:
   a scrambler having a first input operative to receive first data to be scrambled, a second input operative to receive second data to be descrambled, a first output operative to provide scrambled first data, and a second output operative to output descrambled second data, wherein the scrambler is configured to scramble the first data to obtain the scrambled first data and descramble the second data to obtain the descrambled second data in a byte-parallel fashion and in a time-sequenced manner;
   a flash memory comprising a plurality of pages configured to store the scrambled first data;
   a read retry table (RRT) including a plurality of entries, each of the entries associated with a voltage level;
   a control circuit coupled to the flash memory and configured to:
      retrieve scrambled data from a page of the flash memory;
      determine a number of zeroes or ones of the retrieved data;
      determine whether the number is between a first value and a second value;
      determine that the retrieved data has one or more errors based on determining that the number is not between the first value and the second value;
      retrieve the data from the page of the flash memory using a first voltage level from the RRT; and
      retrieve the data from the page of flash memory using a second voltage level from the RRT based on determining that the retrieved data using the first voltage level has one or more errors,
   wherein the flash memory, the scrambler, the RRT, and the control circuit are manufactured on a same die.

2. The flash memory device of claim 1, wherein the number that is half a number of bits included in the retrieved data is between the first value and the second value.

3. The flash memory device of claim 1, wherein the control circuit is further configured to:
   determine a second number of zeroes or ones of the retrieved data;
   determine whether the second number is between the first value and the second value; and
   determine that the retrieved data has one or more errors based on determining that the second number is not between the first value and the second value.

4. The flash memory device of claim 1, wherein the control circuit is coupled to a counter configured to determine the number of zeroes or ones.

5. The flash memory device of claim 1, wherein the control circuit receives a request for data from the page from a controller coupled to the flash memory device prior to retrieving data from the flash memory using the first voltage level.

6. The flash memory device of claim 1, further comprising an input/output port configured to provide the first data to the scrambler.

7. The flash memory device of claim 6, wherein the input/output port is further configured to provide the descrambled second data to an external device.

8. A flash memory device, comprising:
   a scrambler having a first input operative to receive first data to be scrambled, a second input operative to receive second data to be descrambled, a first output operative to provide scrambled first data, and a second output operative to output descrambled second data, the scrambler is configured to scramble the first data to obtain the scrambled first data and descramble the second data to obtain the descrambled second data in a byte-parallel fashion and in a time-sequenced manner;
   a flash memory comprising a plurality of pages configured to store the scrambled first data;
   a read retry table (RRT) including a plurality of entries, each of the entries associated with a voltage level;
   a control circuit coupled to the flash memory and configured to:
   retrieve scrambled data from a page of the flash memory;
   determine a ratio of ones and zeros in the retrieved data;
   determine whether the ratio is between a first value and a second value;

determine that the retrieved data has one or more errors based on determining that the ratio is not between the first value and the second value;
retrieve the data from the page of the flash memory using a first voltage level from the RRT; and
retrieve the data from the page of flash memory using a second voltage level from the RRT based on determining that the retrieved data using the first voltage level has one or more errors,
wherein the flash memory, the scrambler, the RRT, and the control circuit are manufactured on a same die.

9. The flash memory device of claim 8, wherein the ratio of ones and zeros in the retrieved data that is 1 lies between the first value and the second value.

10. A method of operating a flash memory device comprising a flash memory including a plurality of pages, a read retry table (RRT) comprising a plurality of voltage levels, a control circuit, a counter, and a scrambler, the method comprising:
receiving first data by a first input of the scrambler;
scrambling the first data by the scrambler to obtain scrambled first data;
storing the scrambled first data in one or more pages of the plurality of pages;
retrieving scrambled data from a page of the one or more pages of the plurality of pages by the control circuit;
determining a number of zeroes or ones of the retrieved data by the counter;
determining whether the number is between a first value and a second value;
determining that the retrieved data has one or more errors based on determining that the number is not between the first value and the second value;
retrieving the data from the page of the flash memory using a first voltage level from the RRT; and
retrieving the data from the page of the flash memory using a second voltage level from the RRT based on determining that the retrieved data using the first voltage level has one or more errors,
wherein the scrambler is configured to perform scrambling and descrambling in a byte-parallel fashion and in a time-sequenced manner, and
the flash memory, the RRT, the control circuit, the counter, and the scrambler are fabricated on a same die.

11. The method of claim 10, wherein the number that is half a number of bits included in the retrieved data is between the first value and the second value.

12. The method of claim 10, further comprising:
determining a second number of zeroes or ones of the retrieved data;
determining whether the second number is between the first value and the second value; and
determining that the retrieved data has one or more errors based on determining that the second number is not between the first value and the second value.

13. The method of claim 10, further comprising, upon determining that the number is between a first value and a second value:
descrambling the retrieved data by the scrambler to obtain descrambled data that is the same as the first data;
outputting the descrambled data to an external device.

14. The flash memory device of claim 1, wherein the control circuit is further configured to ensure that the received first data have a sufficient number of bits or bytes, and cause the scrambler to append a sufficient amount of scrambled data to the received first data when the control circuit determines that the received first data does not have sufficient bits or bytes.

15. The flash memory device of claim 1, wherein the control circuit is further configured to send out an error message to an external controller when all the entries of the RRT have been used and the number is determined not between the first value and the second value.

* * * * *